(12) United States Patent
Kang

(10) Patent No.: US 6,865,120 B2
(45) Date of Patent: Mar. 8, 2005

(54) REGISTER ARRAY HAVING TIMING REFERENCE SENSING FUNCTION, FERAM USING THE SAME, AND SENSING METHOD USING TIMING REFERENCE

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/728,849

(22) Filed: Dec. 8, 2003

(65) Prior Publication Data

US 2004/0233695 A1 Nov. 25, 2004

(30) Foreign Application Priority Data

May 23, 2003 (KR) .................................. 10-2003-0032901

(51) Int. Cl.[7] ................................................. G11C 7/00
(52) U.S. Cl. ............. 365/189.12; 365/203; 365/189.11; 365/207
(58) Field of Search ........................... 365/189.12, 203, 365/189.11, 207

(56) References Cited

U.S. PATENT DOCUMENTS 5,563,831 A * 10/1996 Ting .................... 3654/189.09
6,172,925 B1 * 1/2001 Bloker ....................... 365/210

FOREIGN PATENT DOCUMENTS

KR   1019980014400   7/2000

* cited by examiner

*Primary Examiner*—Richard Elms
*Assistant Examiner*—N. Nguyen
(74) *Attorney, Agent, or Firm*—Heller Ehrman White and McAuliffe LLP

(57) ABSTRACT

The present invention discloses a ferroelectric random access memory having a multi-bit line structure. The ferroelectric random access memory includes a plurality of cell array blocks for storing cell data, a common data bus unit for transmitting read/write data, and a timing data register array unit for sensing the read data and outputting the write data to the common data bus unit. The timing data register array unit senses the read data by using timing of a sensing voltage of the common data bus unit to reach the sensing threshold voltage. As a result, the ferroelectric random access memory improves a sensing margin in a low voltage and increases a sensing speed.

13 Claims, 13 Drawing Sheets

US 6,865,120 B2

REGISTER ARRAY HAVING TIMING REFERENCE SENSING FUNCTION, FERAM USING THE SAME, AND SENSING METHOD USING TIMING REFERENCE

BACKGROUND OF THE INVENTION

1. Field of the Invention

The present invention relates to a ferroelectric random access memory (FeRAM) having a timing reference sensing function, and more particularly to an FeRAM having a multi-bit line structure which can sense data of a common data bus by using timing of a sensing voltage of a main bit line to reach a sensing threshold voltage.

2. Description of the Background Art

In general, an FeRAM has a data processing speed equivalent to a dynamic random access memory (DRAM), preserves data even when power is off, and thus gains popularity as a next generation memory.

The FeRAM is a memory having an extremely-similar structure to the DRAM. The FeRAM employs a ferroelectric substance to form a capacitor, and thus uses high remanent polarization which is a property of the ferroelectric substance. Even if electric fields are removed, data are not deleted in the FeRAM due to the remanent polarization.

The basic structure and operation principles of the FeRAM have been disclosed in Korea Patent application No. 10-1998-14400 by the same inventors as the present invention. Therefore, detailed explanations thereof are omitted.

A cell sensing voltage decreases as a operation voltage of the FeRAM becomes lower. It is thus difficult to attain a high speed in an 1-transistor 1-capacitor (1T1C) circuit structure.

Especially when the cell data sensing voltage is low, a voltage margin for timing sensing is too small to sense the cell data. Moreover, the sensing margin may decrease by variations of the timing sensing voltage itself.

SUMMARY OF THE INVENTION

The present invention is achieved to solve the above problems. Accordingly, it is an object of the present invention to improve a sensing margin in a low voltage and to increase a sensing speed by improving a data sensing method.

In order to achieve the above-described object of the invention, a timing register array having a timing reference sensing function, and a ferroelectric random access memory having the same are applied to a multi-bit line structure semiconductor memory device including a sub bit line and a main bit line, and inducing a sensing voltage of the main bit line by converting a sensing voltage of the sub bit line into current.

According to one aspect of the invention, the timing register array includes: a bus pull-up unit for pulling up a data bus in precharge; a sense amp unit for sensing a sensing voltage of the data bus according to a preset sensing threshold voltage; and a timing data sensing unit for sensing a sensing value of the sense amp unit by using timing of the sensing voltage of the pulled-up data bus to reach the sensing threshold voltage, and outputting the sensed value to a data buffer.

According to another aspect of the invention, the ferroelectric random access memory includes: a plurality of cell array blocks having the cell arrays; a common data bus shared by the plurality of cell array blocks, for transmitting read data and write data for the cell array blocks; and a timing data register array unit connected to the common data bus, for sensing the read data and, outputting the write data to the common data bus, wherein the timing data register array unit senses the read data by using timing of a sensing voltage of the common data bus to reach a sensing threshold voltage.

A data sensing method using timing reference is applied to a data sensing method of the ferroelectric random access memory having the multi-bit line structure.

According to yet another aspect of the invention, a data sensing method using timing reference senses data values of a common data bus by using different timings of sensing voltages of the common data bus corresponding to different data values to reach a sensing threshold voltage, respectively.

According to yet another aspect of the invention, a data sensing method using timing reference includes: a first step for sensing first timing and second timing of sensing voltages for data high and data low of a common data bus to reach a sensing threshold voltage according to variations of the sensing voltages of the common data bus by a sensing voltage of a sub bit line; a second step for sensing the sensing voltages of the common data bus; and a third step for storing and outputting the sensing values between the first timing and the second timing.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A ferroelectric random access memory (FeRAM) in accordance with preferred embodiments of the present invention will now be described in detail with reference to the accompanying drawings.

Figure 1:
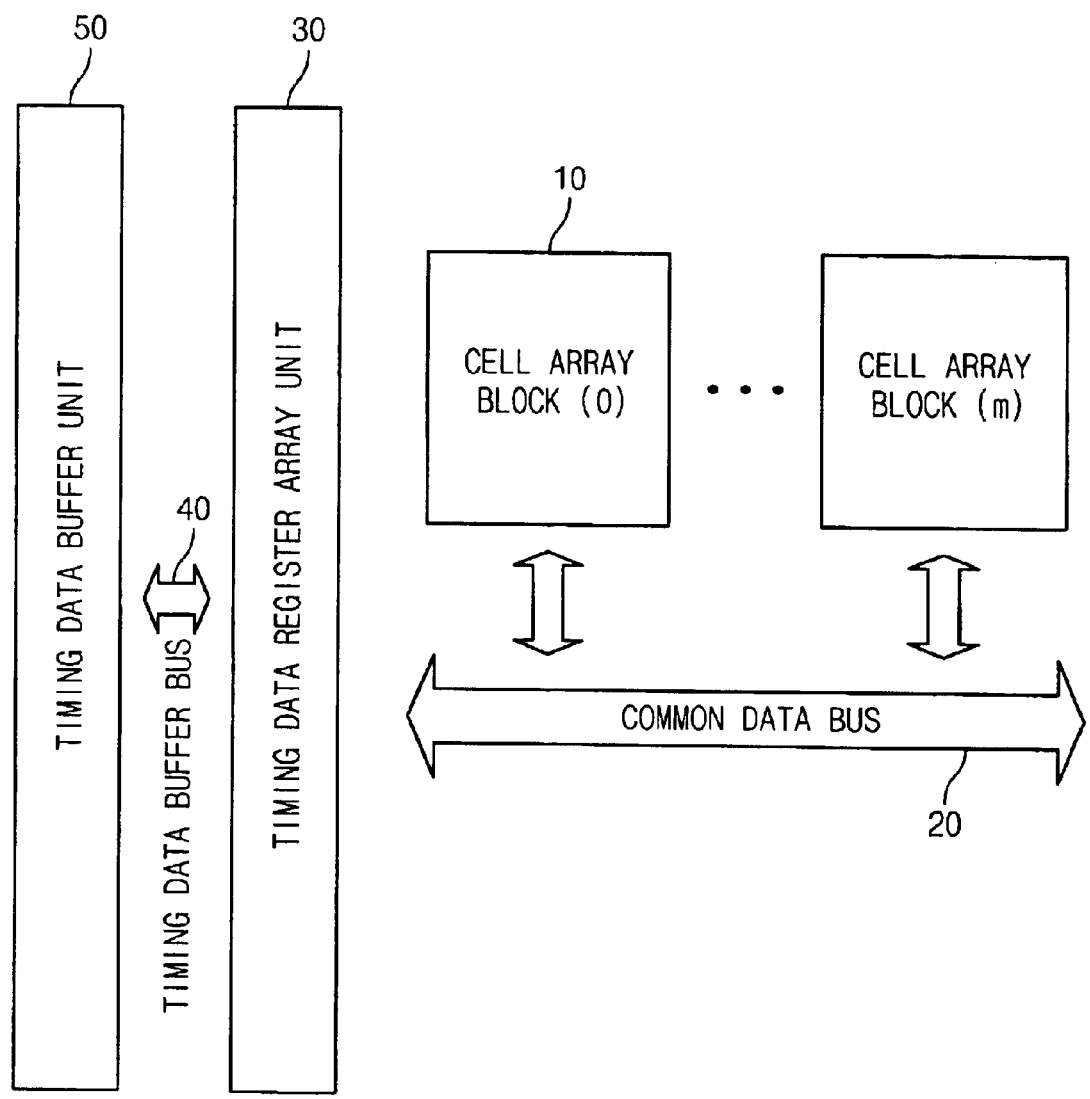
FIG. 1 is a structure diagram illustrating an FeRAM in accordance with a first embodiment of the present invention.

FIG. 1 is a structure diagram illustrating an FeRAM in accordance with a first embodiment of the present invention.

The FeRAM includes a plurality of cell array blocks 10, a common data bus 20, a timing data register array unit 30, a timing data buffer bus 40, and a timing data buffer unit 50.

Each of the cell array blocks 10 has a plurality of cell arrays for storing data. In accordance with the present invention, the cell array blocks 10 include the multi-bit line structure cell arrays having sub bit lines and main bit lines, and inducing sensing voltages of the main bit lines by converting sensing voltages of the sub bit lines into current. The plurality of cell array blocks 10 share the common data bus 20.

The timing data register array unit 30 is connected to the cell array blocks 10 through the common data bus 20, for sensing read data from the cell array blocks 10 and outputting the sensed data to the timing data buffer bus 40. In addition, the timing data register array unit 30 is connected to the timing data buffer unit 50 through the timing data buffer bus 40, for outputting write data from the timing data buffer unit 50 to the common data bus 20. Here, when sensing the data of the common data bus 20, the timing data register array unit 30 distinguishes data high and data low by using timing of data to reach a sensing threshold voltage.

The timing data buffer unit 50 buffers data inputted from a I/O port (not show) and transmitted to the timing data register array unit 30 and data inputted from the timing data register array unit 30 and outputted to the I/O port. The timing data buffer unit 50 is connected to the timing data register array unit 30 through the data buffer bus 40.

In the read operation mode, the data transmitted from the cell array blocks 10 to the common data bus 20 are sensed and stored by the timing data register array unit 30. The read data stored in the timing data register array unit 30 are outputted to the timing data buffer unit 50 through the data buffer bus 40, and restored in the cell array blocks 10.

In the write operation mode, the data inputted from the timing data buffer unit 50 are stored in the timing data register array unit 30 through the data buffer bus 40. The write data stored in the timing data register array unit 30 are recorded on the cell array block 10 through the common data bus 20.

Figure 2:
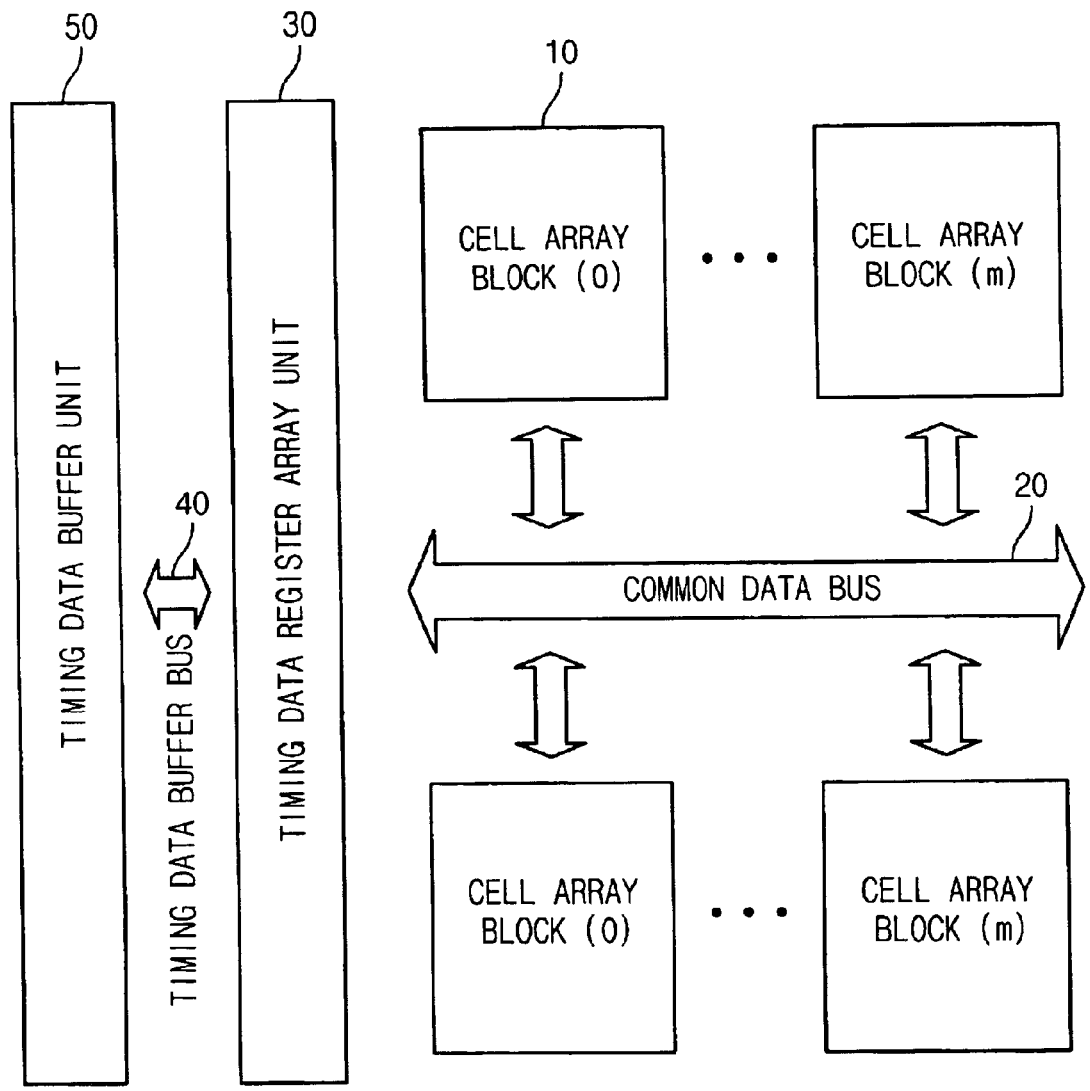
FIG. 2 is a structure diagram illustrating an FeRAM in accordance with a second embodiment of the present invention.

FIG. 2 is a structure diagram illustrating an FeRAM in accordance with a second embodiment of the present invention.

In the FeRAM of FIG. 2, the cell array blocks 10 are arranged in the upper and lower portions of the common data bus 20 to share the common data bus 20. The other elements of the FeRAM have the same structures and functions as FIG. 1.

Figure 3:
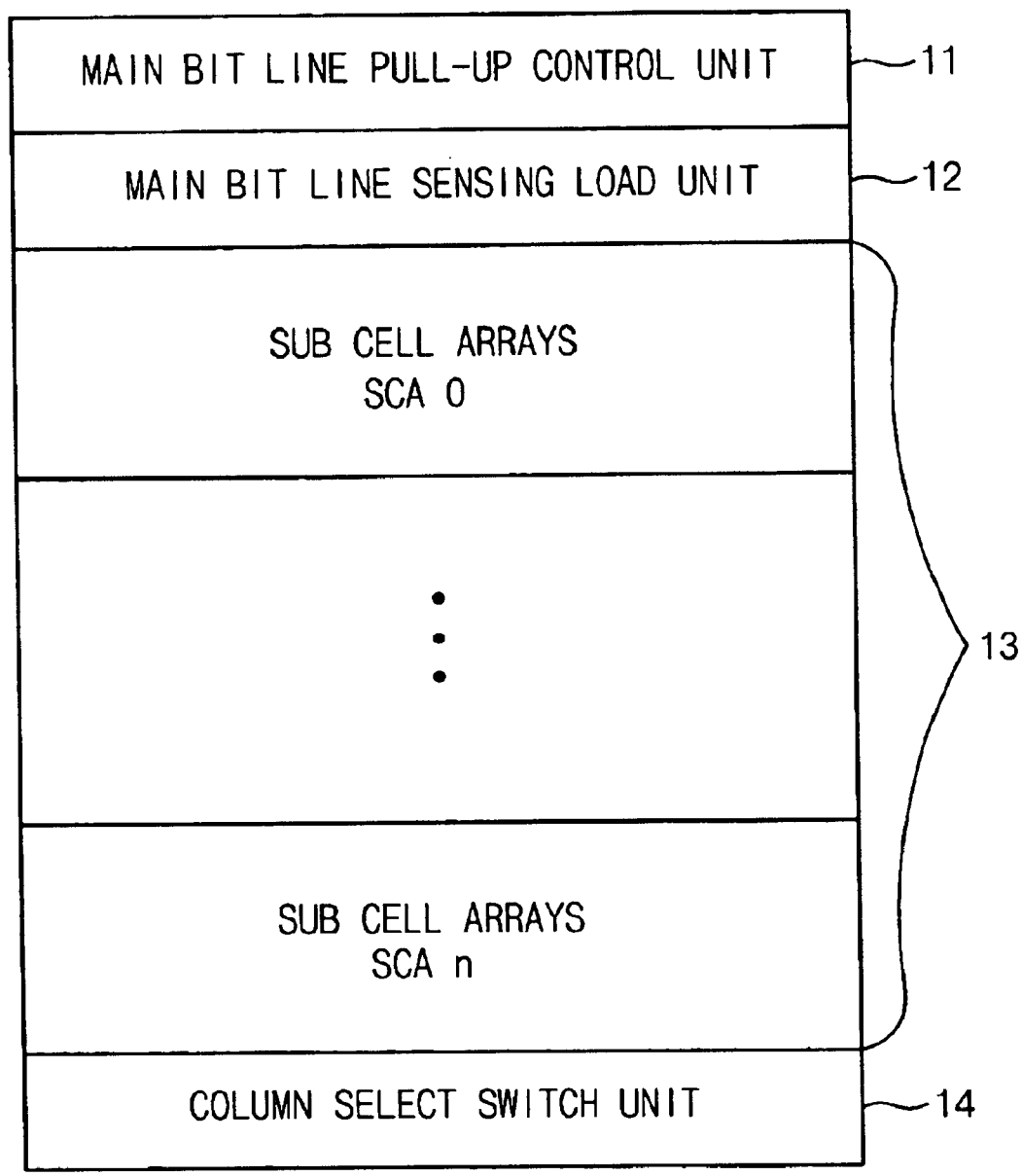
FIG. 3 is a detailed structure diagram illustrating a cell array block of FIGS. 1 and 2.

FIG. 3 is a detailed structure diagram illustrating the cell array block 10 of FIGS. 1 and 2.

The cell array block 10 includes a main bit line pull-up control unit 11, a main bit line sensing load unit 12, a plurality of sub cell arrays 13 and a column select switch unit 14. Main bit lines of the sub cell arrays 13 are connected to the common data bus 20 through the column select switch unit 14.

Figure 4:
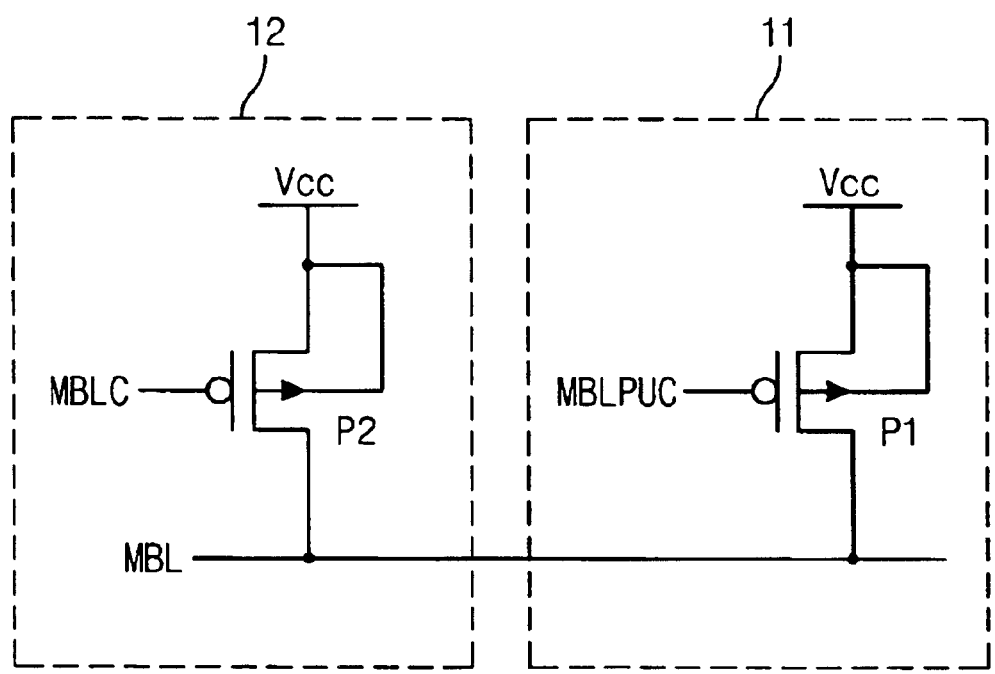
FIG. 4 is a detailed circuit diagram illustrating a main bit line pull-up control unit and a main bit line sensing load unit of FIG. 3.

FIG. 4 is a detailed circuit diagram illustrating the main bit line pull-up control unit 11 and the main bit line sensing load unit 12 of FIG. 3.

The main bit line pull-up control unit 11 includes a PMOS transistor P1 for pulling up the main bit line MBL according to a main bit line pull-up control signal MBLPUC in precharge. The PMOS transistor P1 has its source terminal and drain terminal connected respectively to a power voltage terminal Vcc and the main bit line MBL, and its gate terminal connected to receive the main bit line pull-up control signal MBLPUC.

The main bit line sensing load unit 12 includes a PMOS transistor P2 for controlling a sensing load of the main bit line MBL. The PMOS transistor P2 has its source terminal and drain terminal connected respectively to the power voltage terminal Vcc and the main bit line MBL, and its gate terminal connected to receive a main bit line control signal MBLC.

Figure 5:
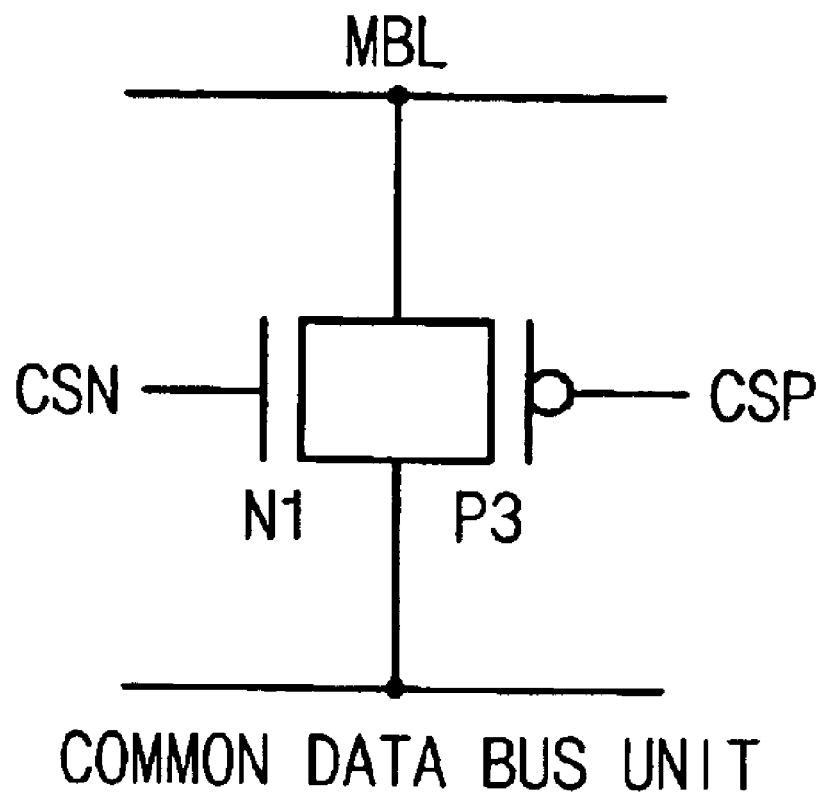
FIG. 5 is a detailed circuit diagram illustrating a column select switch unit of FIG. 3.

FIG. 5 is a detailed circuit diagram illustrating the column select switch unit 14 of FIG. 3.

The column select switch unit 14 connects the main bit line MBL to the common data bus 20 according to column select signals CSN and CSP. The column select switch unit 14 includes an NMOS transistor N1 and a PMOS transistor P3 which are connected between the main bit line MBL and the common data bus unit 20, and which have their gate terminals connected to receive the column select signals CSN and CSP, respectively.

Figure 6:
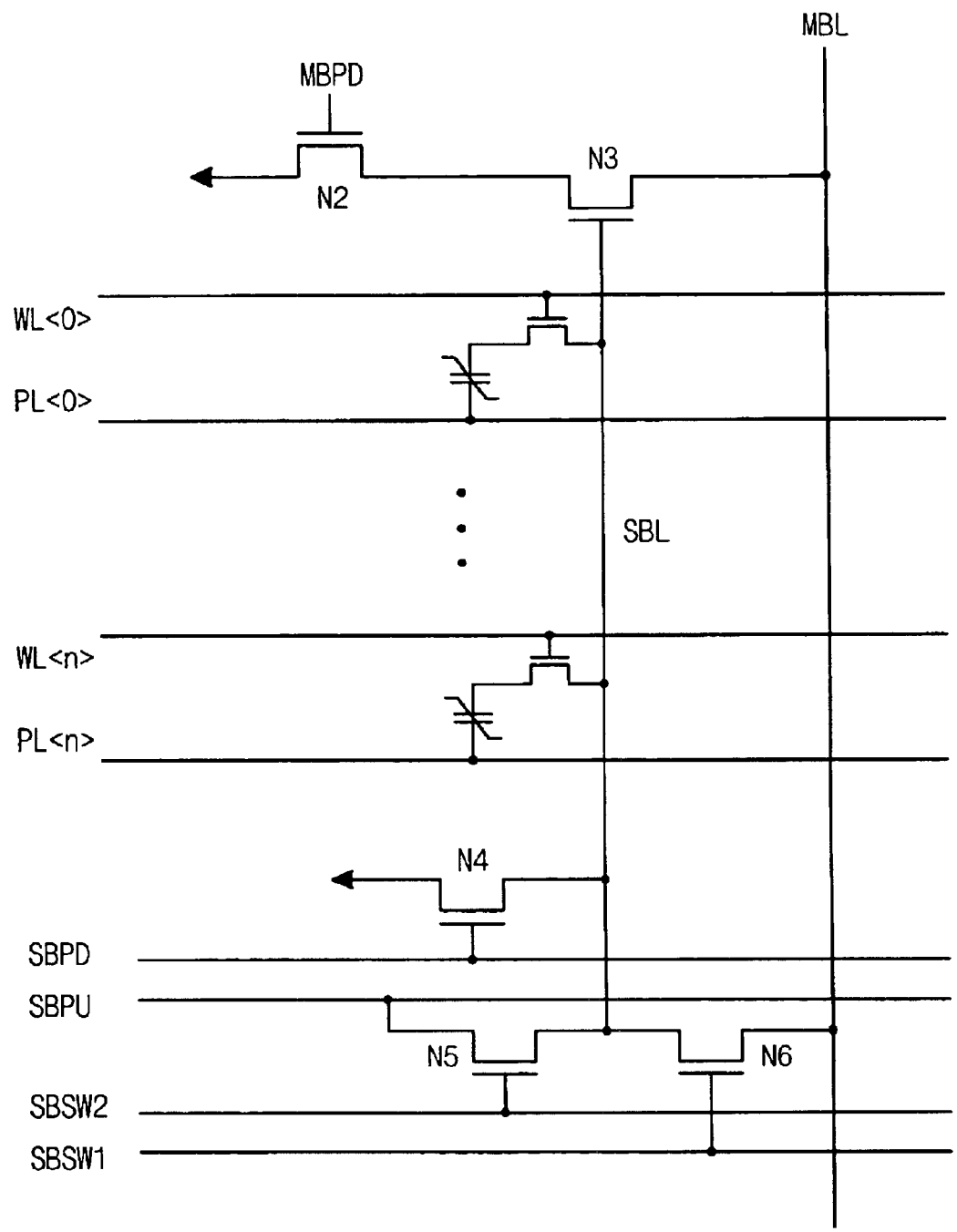
FIG. 6 is a detailed circuit diagram illustrating a unit sub cell array.

FIG. 6 is a detailed circuit diagram illustrating one SCA0 of the unit sub cell arrays SCA0~SCAn of FIG. 3.

Each of the main bit lines MBL of the sub cell array SCA0 is selectively connected to one of a plurality of sub bit lines SBL. That is, only one of a plurality of sub bit line select signals SBSW1 is activated to turn on a corresponding NMOS transistor N6. Accordingly, load of the main bit line MBL is reduced to load of one sub bit line SBL. In addition, when a sub bit line pull-down signal SBPD is activated to turn on an NMOS transistor N4, the sub bit line SBL is adjusted to a ground voltage level.

The sub bit line pull-up signal SBPU controls power supplied to the sub bit line SBL, and the sub bit line select signal SBSW2 controls the sub bit line pull-up signal SBPU to be selectively transmitted to the sub bit line SBL. For example, in order to generate a high voltage in a low voltage, the memory supplies a higher voltage than the power voltage Vcc by the sub bit line pull-up signal SBPU. Thereafter, the memory activates the sub bit line select signal SBSW2 to turn on an NMOS transistor N5, thereby supplying a high voltage to the sub bit line SBL.

A plurality of unit cells are connected to the sub bit line SBL.

An NMOS transistor N2 is connected between a ground voltage terminal and an NMOS transistor N3, and has its gate terminal connected to receive a main bit line pull-down signal MBPD. The NMOS transistor N3 is connected between the NMOS transistor N2 and the main bit line MBL, and a gate terminal of the NMOS transistor N3 is connected to the sub bit line SBL. When the main bit line pull-down signal MBPD is activated, the NMOS transistor N3 induces a sensing voltage of the main bit line by converting a sensing voltage of the sub bit line SBL into current.

For example, when the cell data is high, the voltage of the sub bit line SBL increases, and more current flows through the NMOS transistor N3, to remarkably reduce a voltage level of the main bit line MBL. Conversely, when the cell data is low, the voltage of the sub bit line SBL decreases, and less current flows through the NMOS transistor N3, to slightly reduce the voltage level of the main bit line MBL.

That is, the cell data value can be obtained by using voltage level differences of the main bit line MBL by the cell data.

Figure 7:
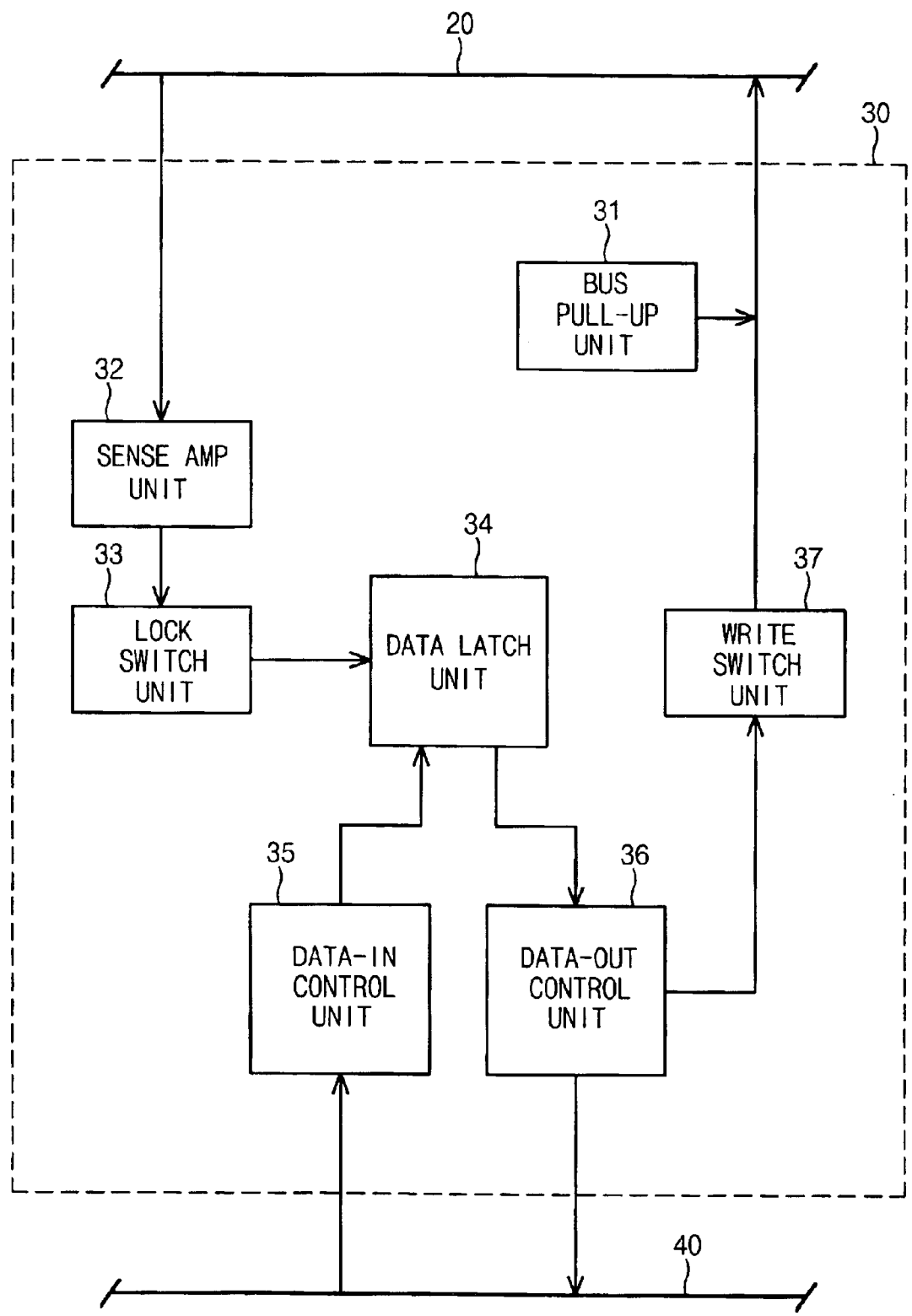
FIG. 7 is a structure diagram illustrating a timing data register array unit of FIG. 1.
Figure 8:
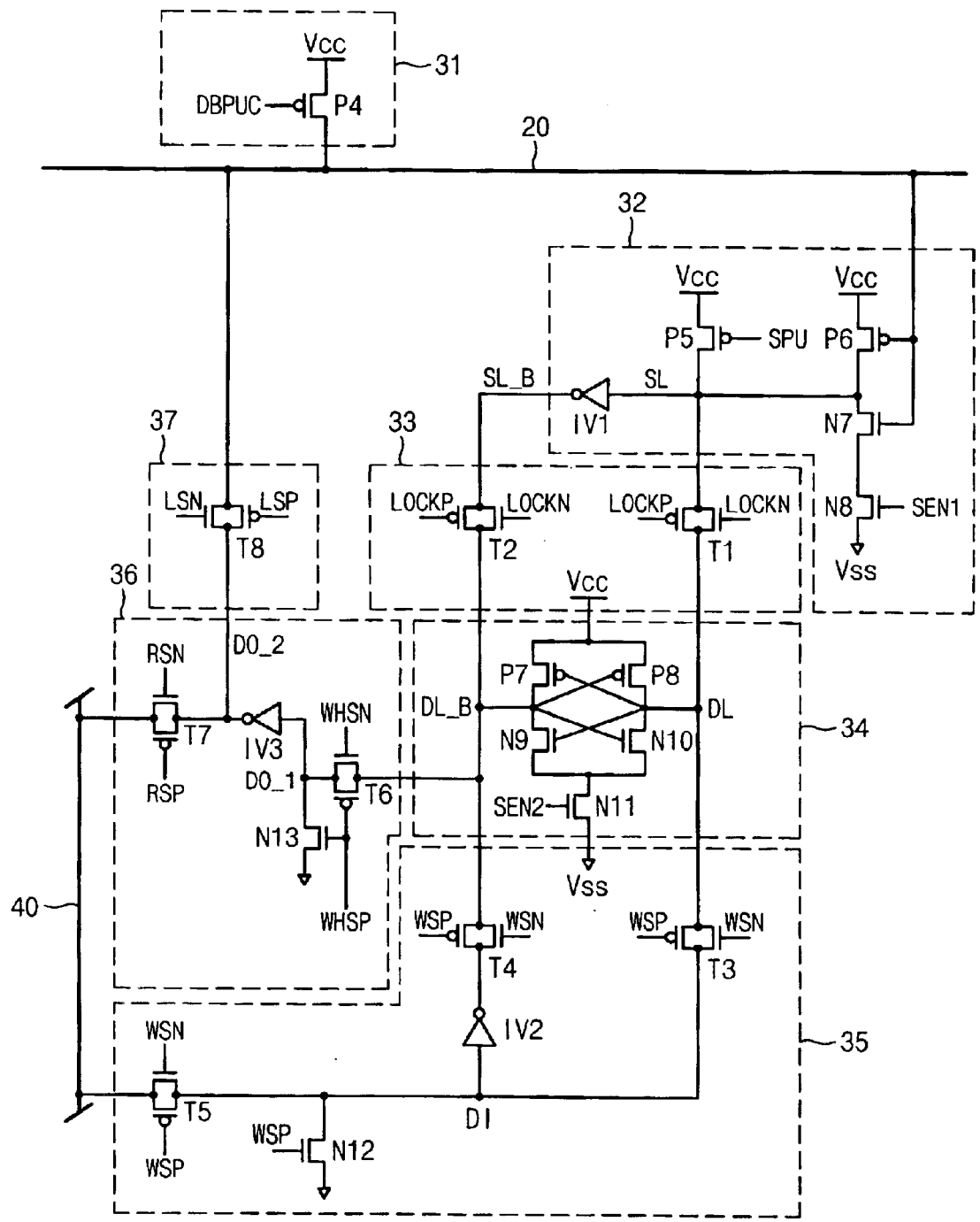
FIG. 8 is a detailed circuit diagram illustrating the timing data register array unit of FIG. 7.

FIG. 7 is a structure diagram illustrating the timing data register array unit 30 of FIG. 1, and FIG. 8 is a detailed circuit diagram illustrating the timing data register array unit 30 of FIG. 7.

The timing data register array unit 30 includes a bus pull-up unit 31, a sense amp unit 32, a lock switch unit 33, a data latch unit 34, a data-in control unit 35, a data-out control unit 36 and a write switch unit 37.

The bus pull-up unit 31 pulls up the common data bus 20 to a high level in precharge. The bus pull-up unit 31 has a PMOS transistor P4 which is connected between the power voltage terminal Vcc and the common data bus 20, and which has its gate terminal connected to receive a data bus pull-up control signal DBPUC.

The sense amp unit 32 senses read data of the common data bus 20 according to a sensing control signal SEN1. The sense amp unit 32 includes PMOS transistors P5 and P6, NMOS transistors N7 and N8, and an inverter IV1.

The PMOS transistor P5 is connected between the power voltage terminal Vcc and a node SL, and has its gate terminal connected to receive a control signal SPU for pulling up the node SL in precharge. The PMOS transistor P6 is connected between the power voltage terminal Vcc and the node SL, and has its gate terminal connected to the common data bus 20. The NMOS transistors N7 and N8 are connected in series between the node SL and the ground voltage terminal. The NMOS transistor N7 has its gate terminal commonly connected to a gate termninal of the PMOS transistor P6, and the NMOS transistor NB has its gate terminal connected to receive the sensing control signal SEN1. The inverter IV1 inverts the signal of the node SL and outputs the inverted signal to a node SL_B. The control signal SPU and the sensing control signal SEN1 have a high level in the active period.

The lock switch unit 33 controls the two outputs from the sense amp unit 32 to be transmitted to the data latch unit 34. The lock switch unit 33 includes transmission gates T1 and T2 turned on/off according to lock signals. LOCKN/LOCKP, for outputting the data of the two output nodes SL and SL_B of the sense amp unit 32 to the data latch unit 34, respectively. Here, the lock signals LOCKN/LOCKP are outputted according to timings of the data values (high and low) of the common data bus 20 to reach a sensing threshold value. That is, a voltage change rate of the main bit line MBL is different according to the voltage level (data high or data low) of the sub bit line SBL, and thus timings of the data values (high or low) of the common data bus unit 20 to reach the sensing threshold value are different. Therefore, the lock signals LOCKN/LOCKP are generated between the timings of the two data values of the common data bus 20 to reach the sensing threshold value. At this time, the timings of the two data values of the common data bus 20 to reach the sensing threshold value are previously calculated and set in the memory.

The data latch unit 34 is activated according to a control signal SEN2, for storing the read/write data. The data latch unit 34 includes PMOS transistors P7 and P8 and NMOS transistors N9 and N10 having the cross-coupled latch circuit structure, and an NMOS transistor N11 for activating the latch circuit when the control signal SEN2 is activated.

The data-in control unit 35 transmits the write data from the timing data buffer bus 40 to the data latch unit 34 in the write operation mode. Here, a transmission gate T5 transmits the data of the timing data buffer bus 40 to a node DI according to write control signals WSN and WSP. An NMOS transistor N12 is connected between the node D1 and the ground voltage terminal, for pulling down the node DI according to the write control signal WSP. A transmission gate T3 transmits the data of the node DI to a node DL according to the write control signals WSN and WSP. A transmission gate T4 transmits the data of the node DI inverted by an inverter IV2 to a node DL_B according to the write control signals WSN and WSP.

The data-out control unit 36 outputs the data stored in the data latch unit 34 to the timing data buffer bus 40 or the write switch unit 37 according to the operation mode (read/write). Here, a transmission gate T6 transmits the data of the node DL_B to a node DO_1 according to control signals WHSN and WHSP. A transmission gate T7 outputs the data of the node DO_1 inverted by an inverter IV3 to the timing data buffer bus 40 according to read control signals RSN and RSP. An NMOS transistor N13 pulls down the node DO_1 according to the control signal WHSP.

The write switch unit 37 outputs the data of the data-out control unit 36 to the common data bus 20 according to control signals LSN and LSP. Here, the write switch unit 37 includes a transmission gate T8 connected between a node DO_2 and the common data bus 20 and turned on/off according to the control signals LSN and LSP.

Figure 9:
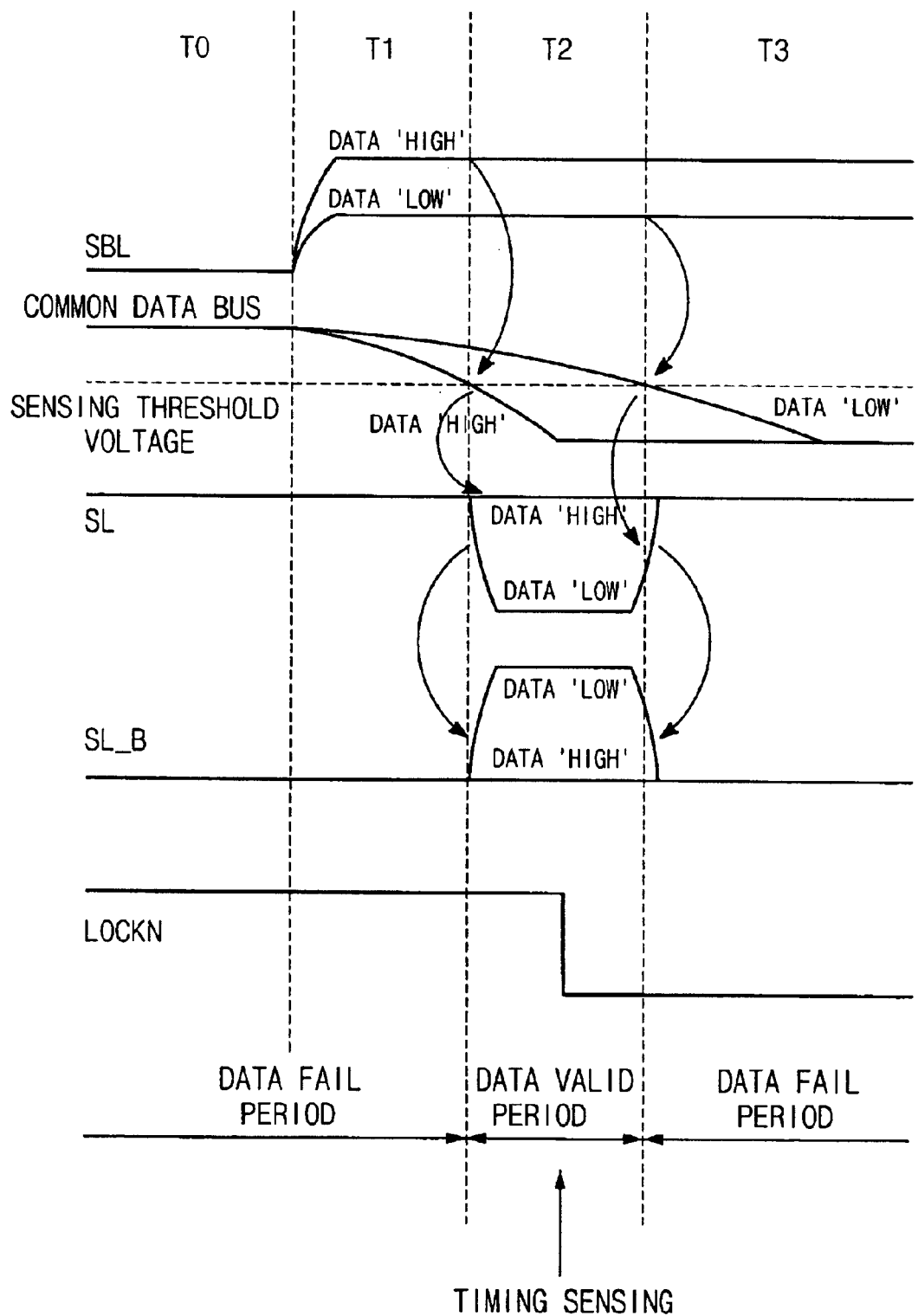
FIG. 9 is a timing diagram provided to explain a data sensing operation using timing reference in the timing data register array unit in accordance with the present invention.

FIG. 9 is a timing diagram provided to explain a data sensing operation using timing reference in the timing data register array unit 30 in accordance with the present invention.

In T0 period, a word line WL and a plate line PL are deactivated, and the main bit line MBL and the common data bus 20 are precharged to a high level. Here, the sub bit line SBL is precharged to a low level, the node SL is precharged to a high level according to the control signal SPU, and the control signals SEN1 and SEN2 are disabled.

When the cell data is read in T1, the sensing voltage of the sub bit line SBL is decided according to the data value. The voltages of the main bit line MBL and the common data bus 20 previously precharged to a high level are reduced according to the sensing voltage of the sub bit line SBL. Because the current flowing through the NMOS transistor N3 is changed by the sensing voltage of the sub bit line SBL, the sensing voltage change rates of the main bit line MBL and the common data bus 20 are different from each other.

When the sensing voltage of the sub bit line SBL is data high, the sensing voltage of the common data bus 20 sharply decreases and reaches the sensing threshold voltage in T2 start point (first timing). Conversely, when the sensing voltage of the sub bit line SBL is data low, the sensing voltage of the common data bus 20 less decreases and reaches the sensing threshold voltage in T3 start point (second timing). Here, the first and second timing values are actually measured according to decrease of the sensing voltage of the common data bus 20 and the preset sensing threshold voltage, and set in the memory.

Accordingly, the two output data values of the sense amp unit 32 are distinguished as data high and data low between the first timing and the second timing (T2). When the data of the node SL and SL_B are sensed between the first timing and the second timing (T2), valid data of the common data bus 20 can be obtained. That is, in T2 period, the sensing voltage of the common data bus 20 is higher or lower than the sensing threshold voltage according to the cell data value, and thus the PMOS transistor P6 or the NMOS transistor N7 of the sense amp unit 32 is selective turned on. Therefore, the values of the nodes SL and SL_B are decided as data high or low.

The data of the node SL and SL_B are stored in the data latch unit 34 according to the lock signals LOCKN/LOCKP activated in the preset timings, and outputted to the timing data buffer bus 40 through the data-out control unit 36 or restored in the cell array blocks 10 through the write switch unit 37.

Figure 10:
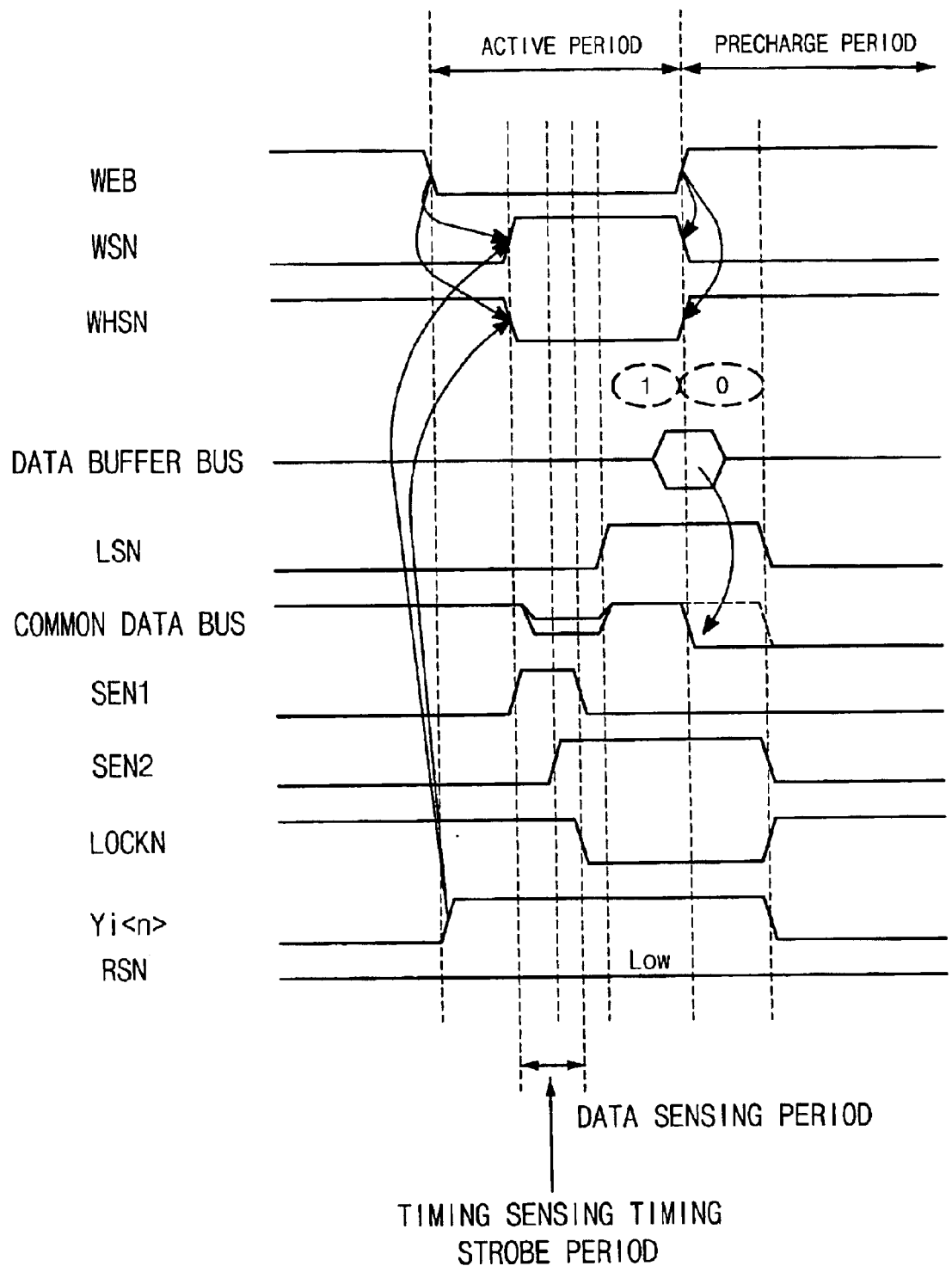
FIG. 10 is a timing diagram when a selected column is operated in a write mode in the timing data register array unit in accordance with the present invention.

FIG. 10 is a timing diagram when a selected column is operated in the write mode in the timing data register array unit 30 in accordance with the present invention.

When a write enable signal WEB and a column select decoder signal Yi<n> are activated, the write control signals WSN and WHSN have high and low levels, respectively. Thereafter, the sensing control signal SEN1 is activated in the data sensing period, the control signal SEN2 is activated in the control signal SEN1 activated period, and thus the sensed data is latched in the data latch unit 34. The latched sensing data is not transmitted to the common data bus 20 because the write control signal WHSN is deactivated.

After the sensing data is latched, if the sensing control signal SEN1 is deactivated, the lock signal LockN is also deactivated. Accordingly, the data sensed by the sense amp unit 32 is intercepted, instead of being transmitted to the data latch unit 34.

When the data is transmitted to the timing data buffer bus 40 for the write operation, the data is latched by the data latch unit 34. When the write control signal WHSN is activated, the latched data is transmitted to the node DO_2 of the data-out control unit 36. The data of the node DO_2 is transmitted to the common data bus 20 because the control signal LSN is activated to a high level.

Figure 11:
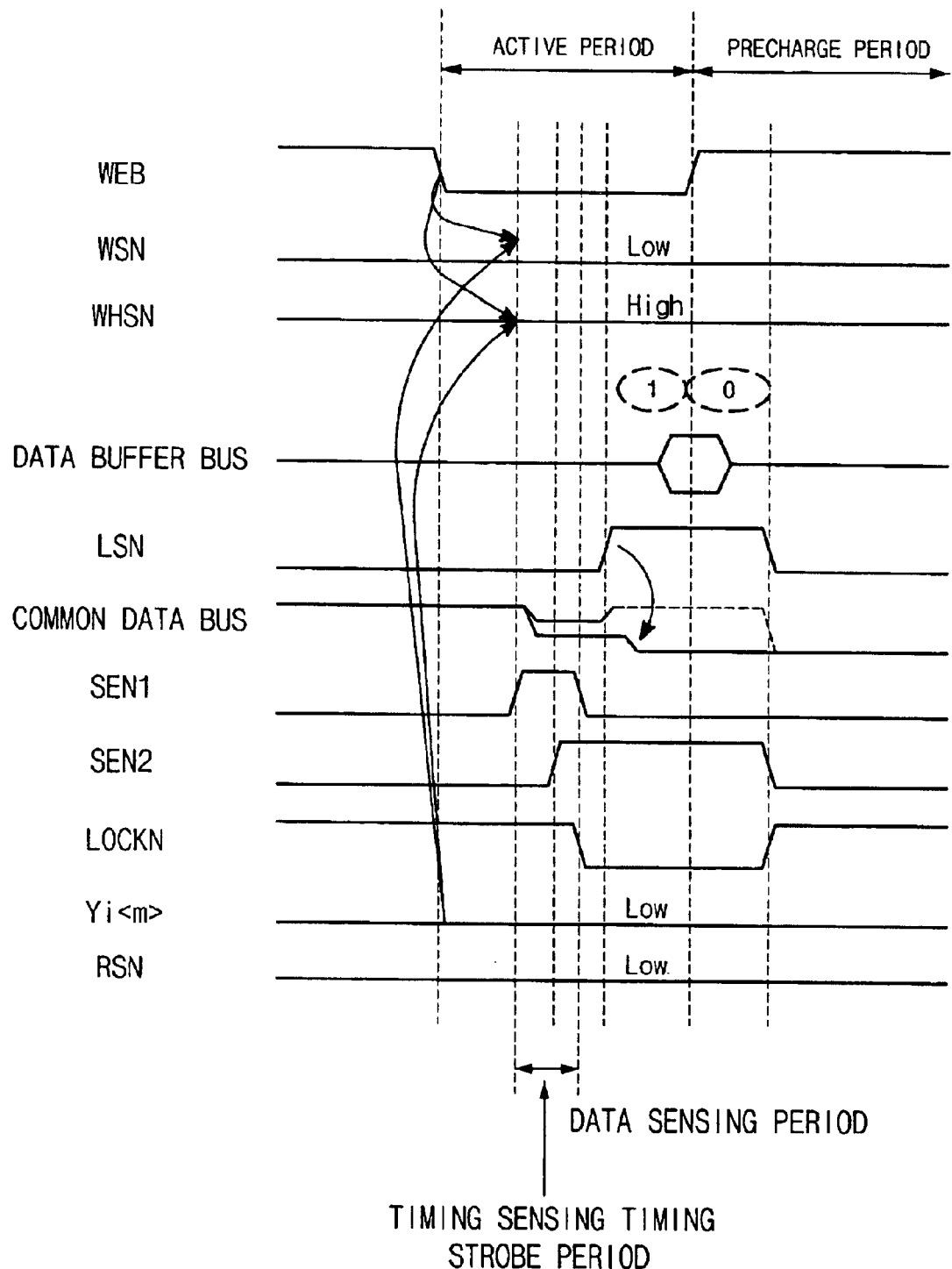
FIG. 11 is a timing diagram when a non-selected column is operated in the write mode in the timing data register array unit in accordance with the present invention.

FIG. 11 is a timing diagram when a non-selected column is operated in the write mode in the timing data register array unit 30 in accordance with the present invention.

A column select decoder signal Yi<m> is not selected, and thus the write control signal WSN is deactivated to a low level, to prevent the data of the timing data buffer bus 40 from being transmitted to the data latch unit 34.

Therefore, the data sensed in the sensing period is stored in the data latch unit 34 and transmitted directly to the common data bus 20. That is, the non-selected column data is operated in the restore mode.

Figure 12:
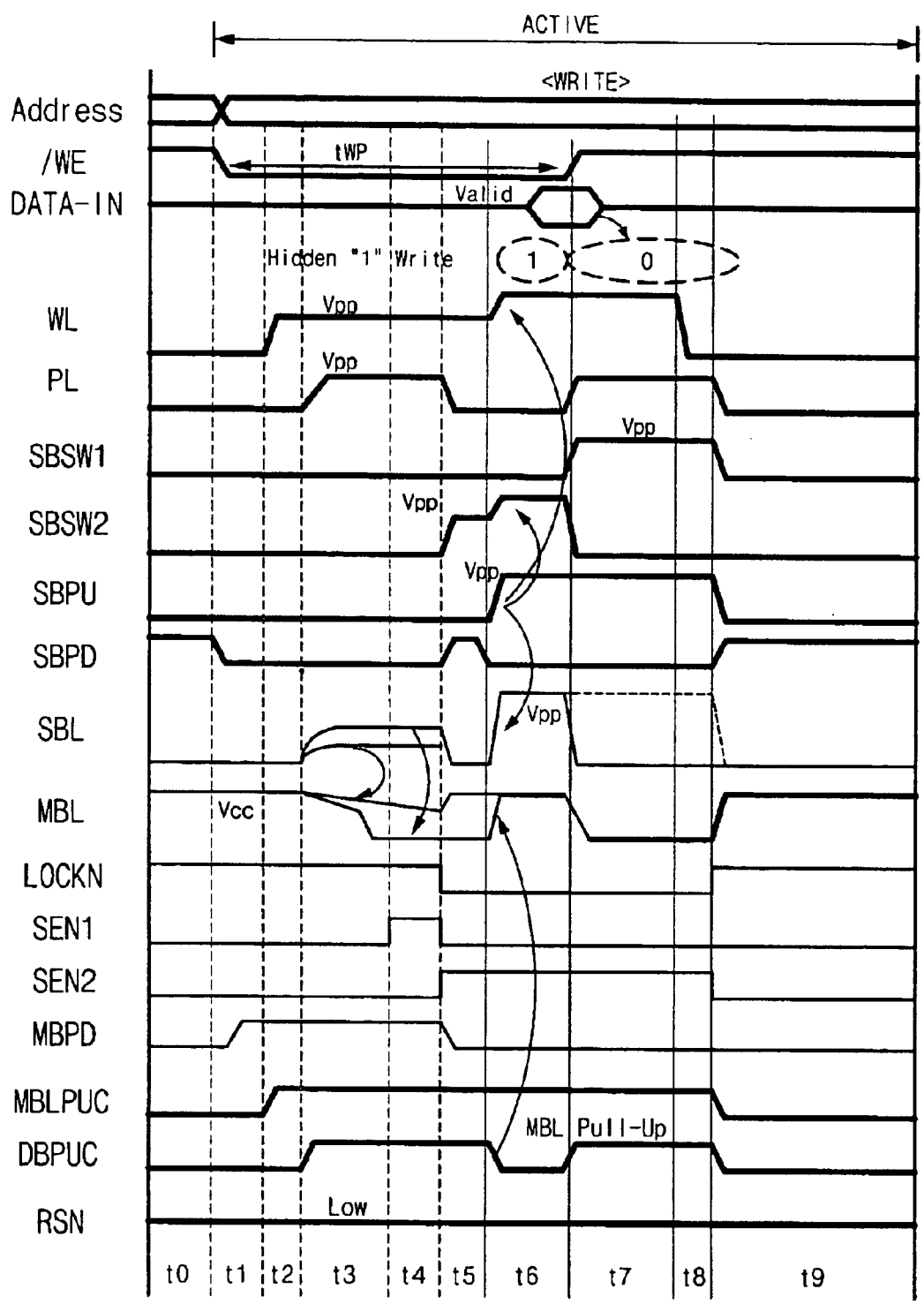
FIG. 12 is a timing diagram provided to explain a write operation of the FeRAM in accordance with the present invention.

FIG. 12 is a timing diagram provided to explain the write operation of the FeRAM in accordance with the present invention.

First, when an address is transited and a write enable signal /WE is deactivated to a low level in T0 period, the write mode is active.

t1 and t2 periods are pull-up periods. That is, before the word line WL and the plate line PL are activated, the main bit line MBL and the common data bus 20 are respectively pulled up according to the main bit line pull-up control signal MBLPUC and the data bus pull-up control signal DBPUC. In t2 period, the word line WL is enabled, and the sub bit line pull-down signal SBPD is disabled to a low level, to initialize a storage node of a cell to a ground level. Here, the word line WL is activated earlier than the plate line PL, and thus the storage node of the cell is stabilized in initialization to improve a sensing margin.

t3 and t4 periods are sensing periods. In t3 period, the plate line PL is activated to a pumping voltage Vpp level, and the cell data is transmitted to the main bit line MBL. The data bus pull-up control signal DBPUC is activated to a high level, and the bus pull-up unit 31 stops pulling up the common data bus unit 20. In t4 period, the sensing control signal SEN1 is activated to a high level, and the sense amp unit 32 senses the data of the common data bus 20. The sensed data is latched by the data latch unit 34 because the control signal SEN2 is activated. When the sensing control signal SEN1 is deactivated to a low level, the lock signals LOCKN/LOCKP are deactivated at the same time, and thus the data transmitted in t5 period is stored in the data latch unit 34. Here, the lock signals LOCKN/LOCKP are generated between the timings of the data high and data low of the common data bus 20 to reach the sensing threshold voltage, as shown in FIG. 9.

In t5 period, the voltage level of the plate line PL is deactivated to a low level, and the sub bit line select signal SBSW2 is activated to the pumping voltage Vpp level. In addition, the sub bit line pull-down signal SBPD is activated to a high level, and the voltage level of the sub bit line SBL becomes the ground level, thereby activating the main bit line MBL to a high level.

In t6 period, the voltage level of the word line WL increases to write the cell data high. The sub bit line pull-up signal SBPU is activated to a high level, the level of the sub bit line select signal SBSW2 increases, and thus the voltage level of the sub bit line SBL increases to the pumping voltage Vpp level. The sub bit line pull-down signal SBPD is deactivated to a low level. The write data transmitted to the data buffer bus unit 40 is stored in the data latch unit 34.

In t7 period, when the write enable signal /WE is activated to a high level, the data stored in the data latch unit 34 is transmitted to the common data bus unit 20 because the write control signal WHSN is activated as shown in FIG. 10. The data of the common data bus 20 is transmitted to the main bit line MBL by the column select switch unit 14. The data of the main bit line MBL is transmitted to the sub bit line SBL because the sub bit line select signal SBSW1 is activated. Accordingly, in order to write new data, while the sub bit line select signal SBSW1 is activated, the data stored in the timing data register array unit 30 are transmitted to the main bit line MBL and the sub bit line SBL. When the data has a level of '0', the '0' level data is stored in the memory cell.

In t6 period, namely the period before writing the data '0', the main bit line MBL is pulled up to the high level. Here, the main bit line MBL is pulled up by the bus pull-up unit 31 according to the data bus pull-up control signal DBPUC.

Figure 13:
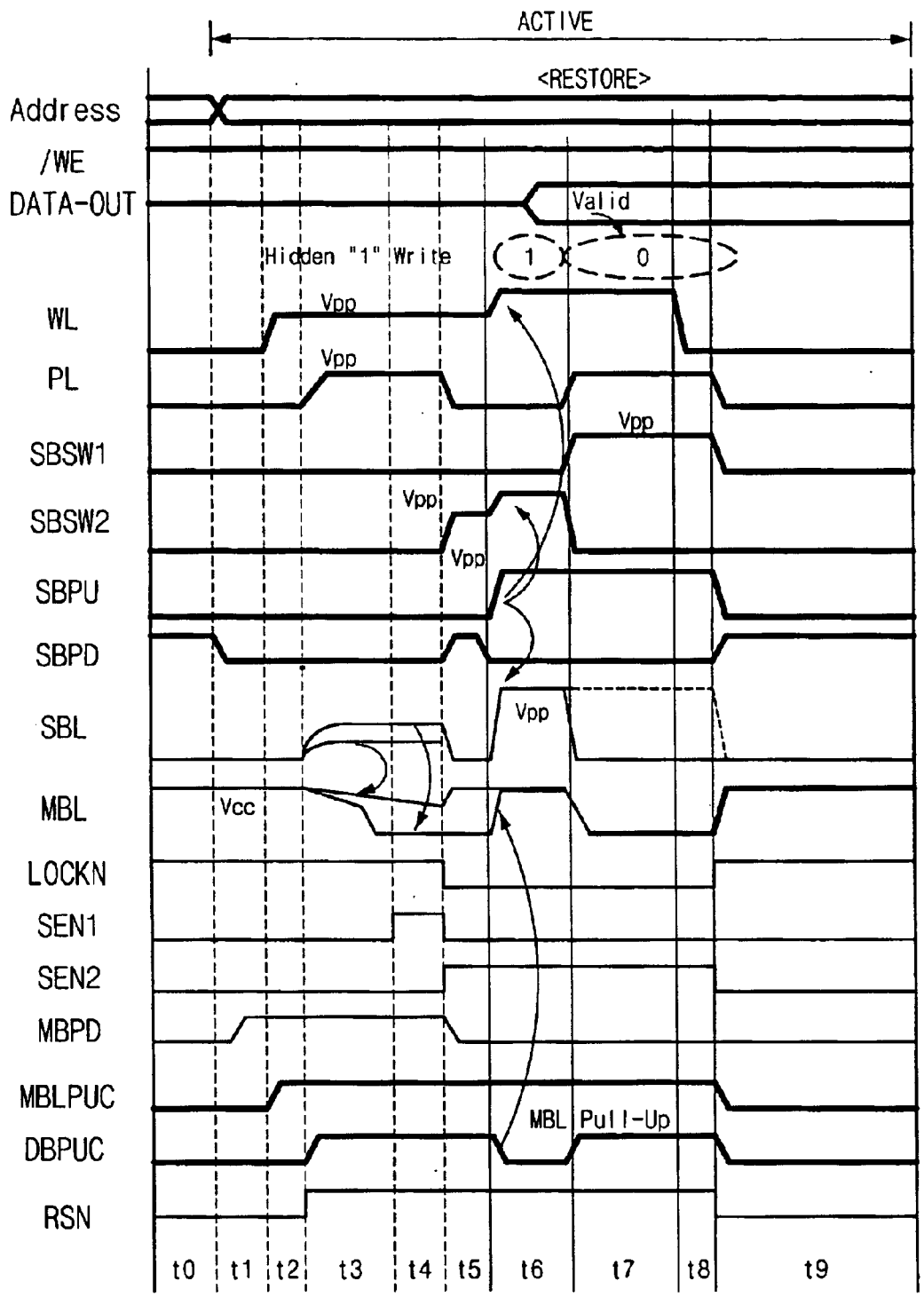
FIG. 13 is a timing diagram provided to explain a read operation of the FeRAM in accordance with the present invention.

FIG. 13 is a timing diagram provided to explain the read operation of the FeRAM in accordance with the present invention.

In the read mode, the write enable signal /WE maintains the power voltage level, and a data output valid period is maintained after t6 period.

Here, the write control signal WSN is maintained in a low level. Therefore, the data inputted through the timing data buffer bus 40 is not recorded on the cell, but the read data stored in the data latch unit 34 is restored in the cell.

In addition, in t3 to t8 periods, the read select signal RSN is activated, to transmit the read data stored in the data latch unit 34 to the timing data buffer bus 40.

As discussed earlier, in accordance with the present invention, the FeRAM having the multi-bit line structure senses the data of the common data bus by using the timing of the data of the main bit line to reach the sensing threshold voltage, instead of using the reference voltage. As a result, the FeRAM improves the sensing margin in the low voltage, and increases the sensing speed. Moreover, the FeRAM which does not use the reference voltage for data sensing removes noises generated by the reference voltage.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A timing data register array for sensing and storing data outputted through a data bus in a multi-bit line structure cell array for inducing a sensing voltage of a main bit line by converting a sensing voltage of a sub bit line into current, the timing data register array comprising:

a bus pull-up unit for pulling up the data bus in precharge;

a sense amp unit for sensing a sensing voltage of the data bus according to a preset sensing threshold voltage; and a timing data sensing unit for sensing a sensing value of the sense amp unit by using timing of the sensing voltage of the pulled-up data bus to reach the sensing threshold voltage, and for outputting the sensing value to a data buffer.

2. The array of claim 1, wherein the timing data sensing unit comprises:

a lock switch unit for selectively transmitting the sensing value of the sense amp unit according to lock signals activated in different timings;

a data latch unit for storing the data transmitted through the lock switch unit;

a data-out control unit for outputting the data stored in the data latch unit; and a write switch unit for transmitting the data of the data-out control unit to the data bus to be restored in the cell array.

3. The array of claim 2, wherein the lock signals are previously measured according to the sensing threshold voltage and decrease of the sensing voltage of the data bus, and activated in the preset timings.

4. A ferroelectric random access memory including a multi-bit line structure cell array for inducing a sensing voltage of a main bit line by converting a sensing voltage of a sub bit line into current, the ferroelectric random access memory having a timing reference sensing function, comprising:

a plurality of cell array blocks having the cell arrays;

a common data bus shared by the plurality of cell array blocks, for transmitting read data and write data for the cell array blocks; and a timing data register array unit connected to the common data bus, for sensing the read data and outputting the write data to the common data bus, wherein the timing data register array unit senses the; read data by using timing of a sensing voltage of the common data bus to reach a sensing threshold voltage.

5. The memory of claim 4, wherein the timing data register array unit comprises:

a bus pull-up unit for pulling up the common data bus in precharge;

a sense amp unit for sensing the data of the common data bus according to the sensing threshold voltage, when receiving a sensing control signal;

a data latch unit for storing the read data and the write data;

a lock switch unit for selectively transmitting the output data from the sense amp unit to the data latch unit according to lock signals;

a data-in control unit for receiving the write data and transmitting the write data to the data latch unit in the write operation;

a data-out control unit for controlling output of the data stored in the data latch unit according to an operation mode; and a write switch unit for transmitting a data of the data-out control unit to the common data bus to be restored in the cell array blocks.

6. The memory of claim 5, wherein the lock signals are previously measured according to the sensing threshold voltage and decrease of the sensing voltage of the common data bus, and activated in the preset timings.

7. The memory of claim 6, wherein the lock switch unit comprises a transmission gate selectively turned on/off according to the lock signals, for selectively transmitting the data of the sense amp unit.

8. The memory of claim 5, wherein the data-out control unit outputs the data stored in the data latch unit to a data buffer and the write switch unit in the read mode, and to the data-out control unit outputs the data stored in the data latch unit to the write switch unit in the write mode.

9. The memory of claim 5, wherein the data-in control unit transmits the write data to the data latch unit when a column select signal is activated.

10. A data sensing method of a memory including a plurality of cell array blocks having a multi-bit line structure for inducing a sensing voltage of a main bit line by converting a sensing voltage of a sub bit line into current, and a common data bus shared by the plurality of cell array blocks, the data sensing method using timing reference which senses data values of the common data bus by using different timings of sensing voltages of the common data bus corresponding to different data values to reach a sensing threshold voltage, respectively.

11. A data sensing method of a memory including a plurality of cell array blocks having a multi-bit line structure for inducing a sensing voltage of a main bit line by converting a sensing voltage of a sub bit line into current, and a common data bus shared by the plurality of cell array blocks, the data sensing method using timing reference, comprising:

a first step for calculating first timing and second timing of sensing voltages of the common data bus to reach a sensing threshold voltage by the sensing voltage of the sub, bit line;

a second step for sensing the sensing voltages of the common data bus; and a third step for storing and outputting the values sensed between the first timing and the second timing.

12. The method of claim 11, wherein the third step activates lock signals between the first timing and the second timing, and senses and stores the sensing voltages at the time of activating the lock signals.

13. The method of claim 11, wherein the first and second timings are timings of the sensing voltages of the common data bus corresponding to data high and data low to reach the sensing threshold voltage.

* * * * *